(12) United States Patent
Vinke et al.

(10) Patent No.: US 7,760,578 B2
(45) Date of Patent: Jul. 20, 2010

(54) ENHANCED POWER DISTRIBUTION IN AN INTEGRATED CIRCUIT

(75) Inventors: David Vinke, Happy Valley, OR (US); Michael N. Dillon, Richfield, MN (US); Bret Alan Oeltjen, Elko, MN (US); Uday Anumalachetty, Apple Valley, MN (US); Thomas Mathews Antisseril, San Ramon, CA (US)

(73) Assignee: LSI Logic Corporation, Milpitas, CA (US)

( * ) Notice: Subject to any disclaimer, the term of this patent is extended or adjusted under 35 U.S.C. 154(b) by 103 days.

(21) Appl. No.: 12/254,421

(22) Filed: Oct. 20, 2008

(65) Prior Publication Data

US 2010/0097875 A1  Apr. 22, 2010

(51) Int. Cl.
*G11C 5/14* (2006.01)
(52) U.S. Cl. .......................... 365/226; 365/63; 365/214
(58) Field of Classification Search .................. 365/226, 365/63, 214
See application file for complete search history.

(56) References Cited

U.S. PATENT DOCUMENTS 6,115,279 A * 9/2000 Kitsukawa et al. ............ 365/63
6,426,890 B1 * 7/2002 Jasinski et al. ............... 365/154
2007/0158695 A1 * 7/2007 Kitsukawa et al. ........... 257/213
2009/0193380 A1 * 7/2009 McElvain et al. ............. 716/12

* cited by examiner

*Primary Examiner*—Tuan T. Nguyen
(74) *Attorney, Agent, or Firm*—Ryan, Mason & Lewis, LLP

(57) ABSTRACT

An integrated circuit structure for distributing power to one or more standard cells in an integrated circuit includes a first plurality of standard cells and a power mesh power connection structure coupled to the cells. Each of the standard cells includes first and second power rails adapted for connection to a voltage supply and a voltage return, respectively, of the standard cells. Each standard cell in a subset of the standard cells is arranged in direct abutment with at least two other standard cells, and at least first and second end cells are arranged in direct abutment with at least one other standard cell of the first plurality of standard cells. The power mesh power connection structure includes a plurality of conductive elements formed in a plurality of different conductive layers in the integrated circuit. The power mesh power connection structure is operative to connect the first and second power rails of the first plurality of standard cells to the voltage supply and voltage return, respectively, and is configured so as to reduce a first voltage differential between respective first power rails of the standard cells and to reduce a second voltage differential between respective second power rails of the standard cells.

20 Claims, 12 Drawing Sheets

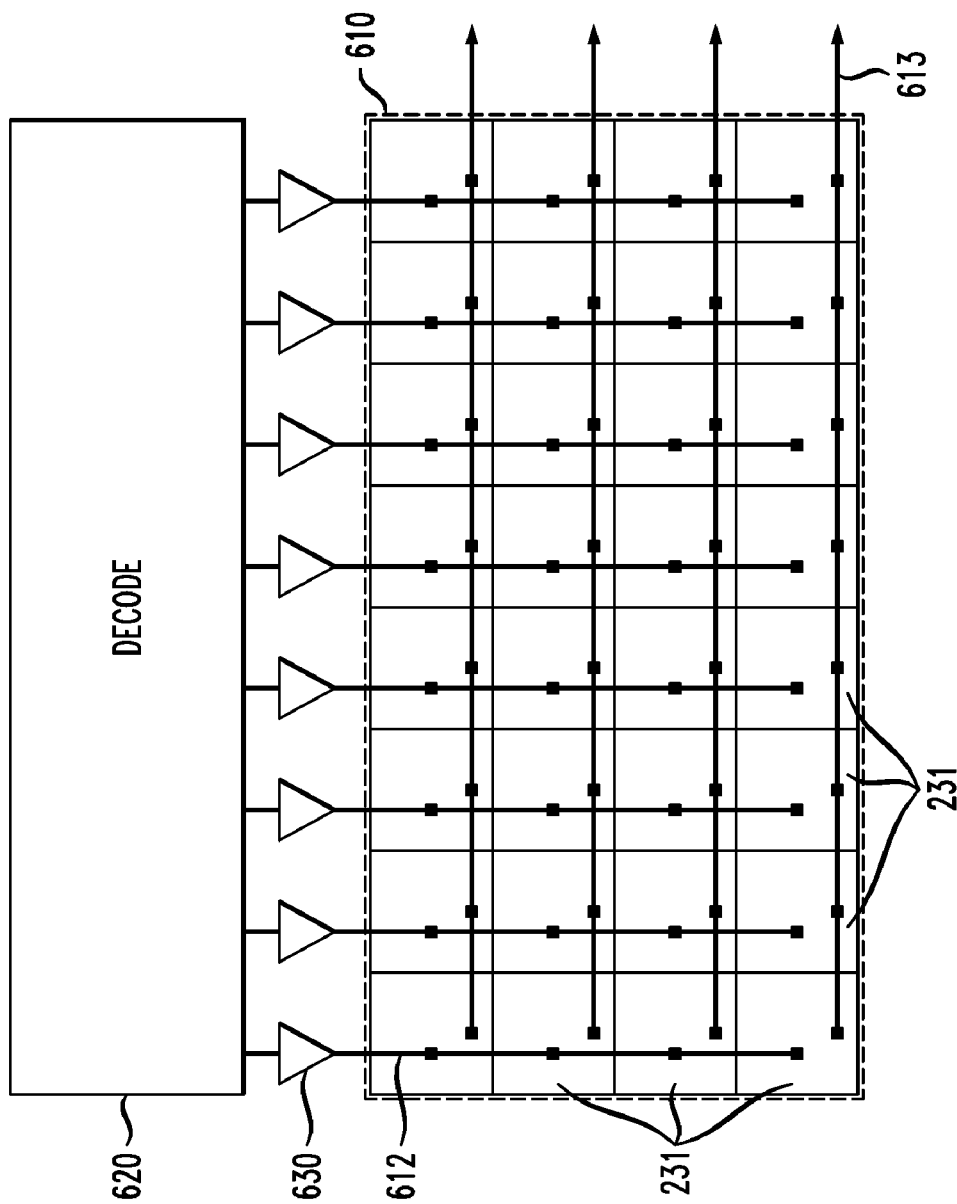

800

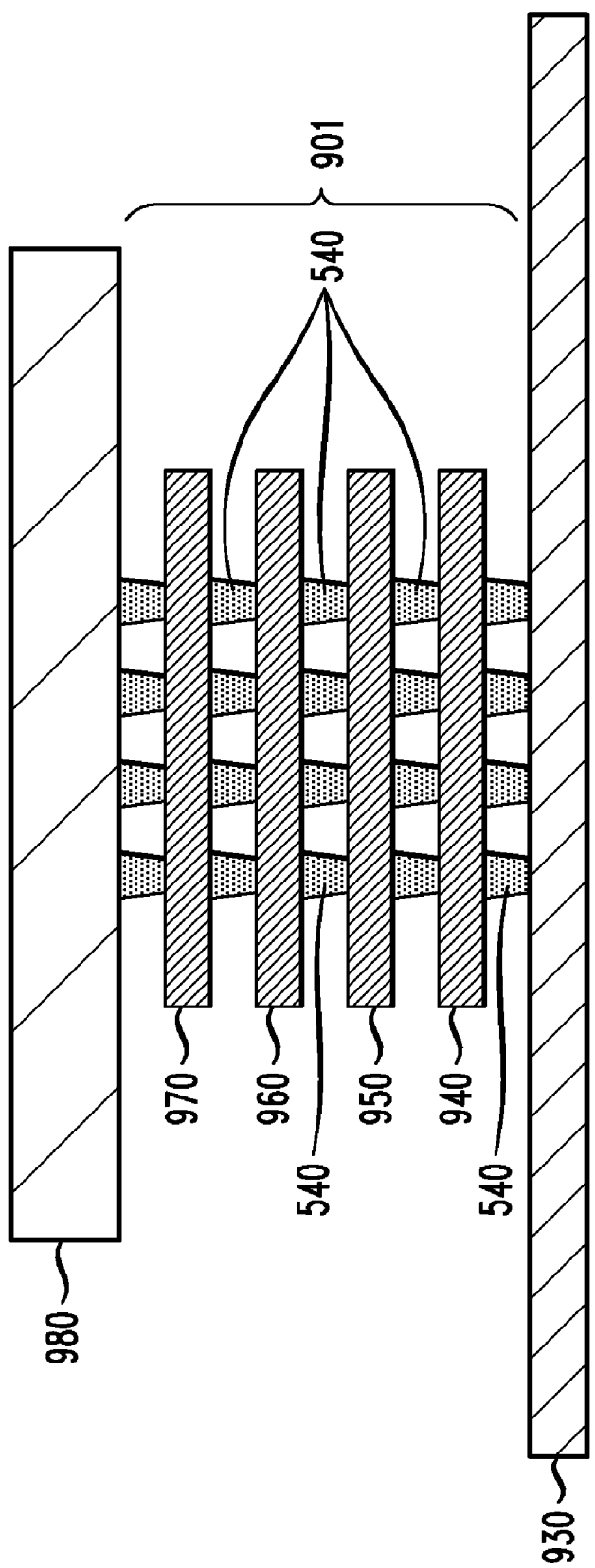

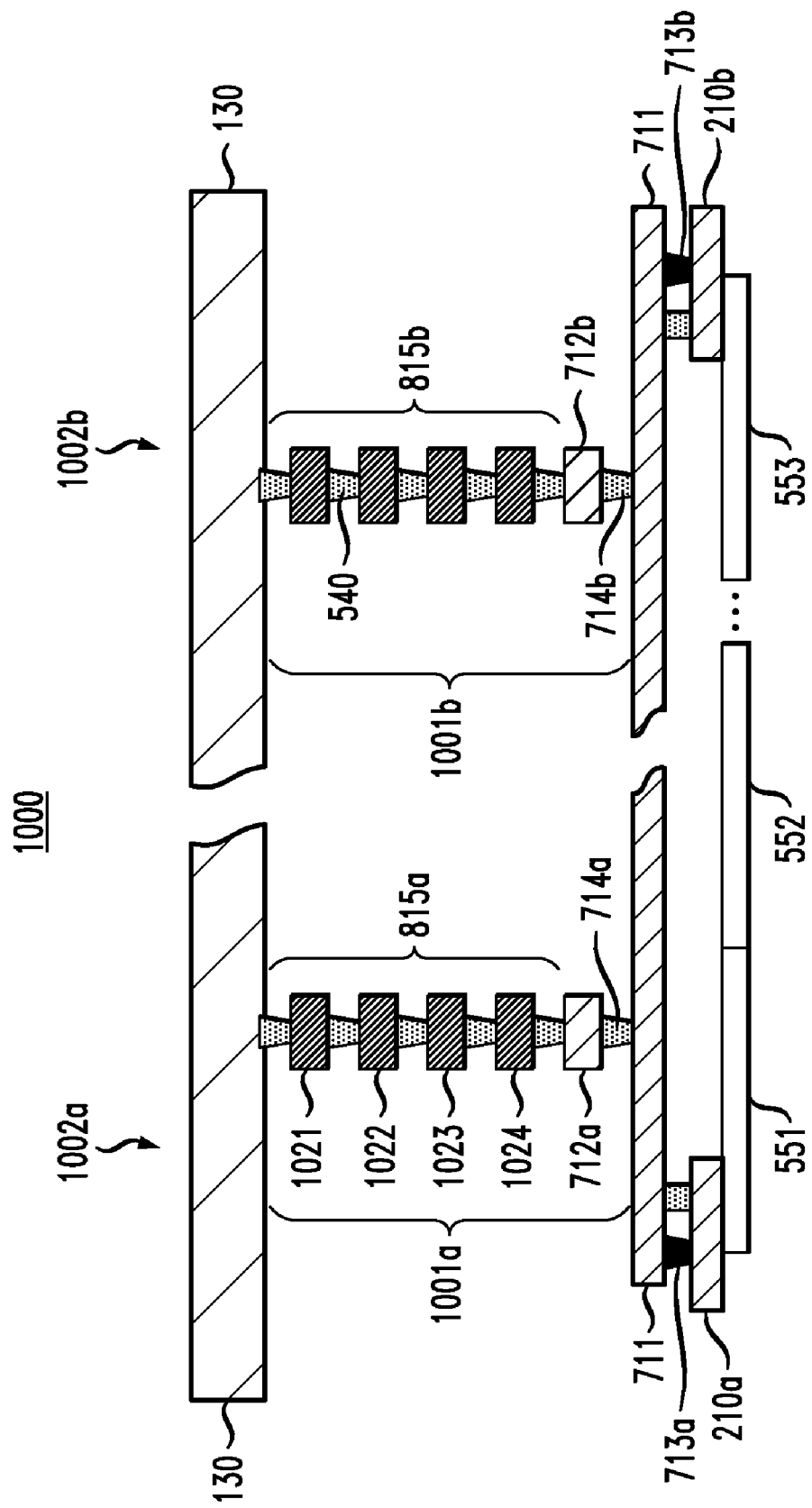

1050

1100

1200

1300

ENHANCED POWER DISTRIBUTION IN AN INTEGRATED CIRCUIT

FIELD OF THE INVENTION

The present invention relates generally to semiconductor devices, and more particularly to power distribution within an integrated circuit (IC) including memory.

BACKGROUND OF THE INVENTION

Recently, there is a trend for increasing memory usage in application specific integrated circuits (ASICs). The Semiconductor Industry Association (SIA) estimates that, by the year 2014, a typical ASIC will comprise about 94 percent memory (by die area). The trend is also for decreasing the size of memories, which are often implemented as latch-based random access memory (LBRAM). However, an important issue with the use of such a large number of LBRAMs is the amount of die area occupied by the memories.

It is common to use static random access memories (SRAMs) within ASICs. SRAMs typically comprise bit lines, word lines and an array of special memory cells, also referred to herein as bit cells, surrounded by specialized circuitry to read data from and/or write data to the array. The memory cells are often organized in groups such that all cells in a given group are coupled to a common bit line. The bit lines are used to write data into the memory cells and to read data from the memory cells.

Typically, the bit lines in SRAMs do not use the same voltage levels to represent a logic "1" or "0" data state as do standard ASIC logic cells. Rather, there is a much smaller voltage differential between a "1" and a "0" data state, and special sense amplifier circuits are generally required to determine whether the bit line is reading a "1" or a "0" data state from a selected memory cell coupled thereto. Using a small voltage differential has an advantage of allowing a smaller memory cell and faster transition times on the bit line. However, a disadvantage is that the sense amplifier circuits add significant area overhead, which can be a large drawback for small memories. Furthermore, SRAMs are more susceptible to IC process defects than standard logic circuitry and may require special built-in-self-test (BIST) logic to test for such defects. For smaller memories, the area of the BIST logic may be larger than the memory itself.

Due to the excessive area of SRAMs, small memories are often implemented as LBRAMs. However, although a memory implemented using LBRAMs generally consumes less die area compared to SRAMs, it is still beneficial to reduce the area requirements of a LBRAM cell to reduce overall die area and cost of the IC. If latches in the memory array are placed as densely as possible, the number of signal wires would essentially completely use all available space above the array. As a result, there would be no room to place required connections between the individual memory cells and power rails in the IC. Consequently, in standard LBRAMs, the latches are placed less densely to allow room for power rail connections, thereby increasing the die area of the IC.

SUMMARY OF THE INVENTION

Embodiments of the present invention provide techniques for efficiently delivering power to standard cells in an IC, including, but not limited to, latch standard cells within LBRAMs and other standard cells. Advantages of the invention include, for example, lower cost ICs resulting from standard cells and LBRAMs that are smaller in die area, increased read and write signal margins within LBRAMs, and improved levels of signal integrity in standard cells and within LBRAMs.

In accordance with one aspect of the invention, an integrated circuit structure for distributing power to one or more standard cells in an integrated circuit includes a first plurality of standard cells and a power mesh power connection structure coupled to the cells. Each of the standard cells includes first and second power rails adapted for connection to a voltage supply and a voltage return, respectively, of the standard cells. Each standard cell in a subset of the standard cells is arranged in direct abutment with at least two other standard cells, and at least first and second end cells are arranged in direct abutment with at least one other standard cell of the first plurality of standard cells. The power mesh power connection structure includes a plurality of conductive elements formed in a plurality of different conductive layers in the integrated circuit. The power mesh power connection structure is operative to connect the first and second power rails of the first plurality of standard cells to the voltage supply and voltage return, respectively, and is configured so as to reduce a first voltage differential between respective first power rails of the standard cells and to reduce a second voltage differential between respective second power rails of the standard cells.

In accordance with another aspect of the invention, a method of forming an integrated circuit structure for distributing power to one or more standard cells in an integrated circuit is provided. The method includes the steps of: forming a first plurality of standard cells on a substrate, each of the first plurality of standard cells including first and second power rails adapted for connection to a voltage supply and a voltage return, respectively, of the standard cells, each standard cell in a subset of the first plurality of standard cells being arranged in direct abutment with at least two other standard cells of the first plurality of standard cells, the first plurality of standard cells including at least first and second end cells arranged in direct abutment with at least one other standard cell of the first plurality of standard cells; and forming a power mesh power connection structure, the power mesh connection structure including a plurality of conductive elements formed in a plurality of different conductive layers in the integrated circuit and being configured to connect the first and second power rails of the first plurality of standard cells to the voltage supply and voltage return, respectively, the power mesh connection structure being configured so as to reduce a first voltage differential between respective first power rails of the first plurality of standard cells and to reduce a second voltage differential between respective second power rails of the first plurality of standard cells.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 6 is a simplified block diagram depicting at least a portion of an exemplary LBRAM, according to an embodiment of the present invention.

FIG. 9 is a cross-sectional view depicting at least a portion of an exemplary via short stack structure, according to an embodiment of the present invention.

FIGS. 10A and 10B show a cross-sectional view and corresponding schematic diagram, respectively, relating to the exemplary extended power connecting layout of FIG. 8, according to an embodiment of the present invention.

DETAILED DESCRIPTION OF THE INVENTION

Figure 1:
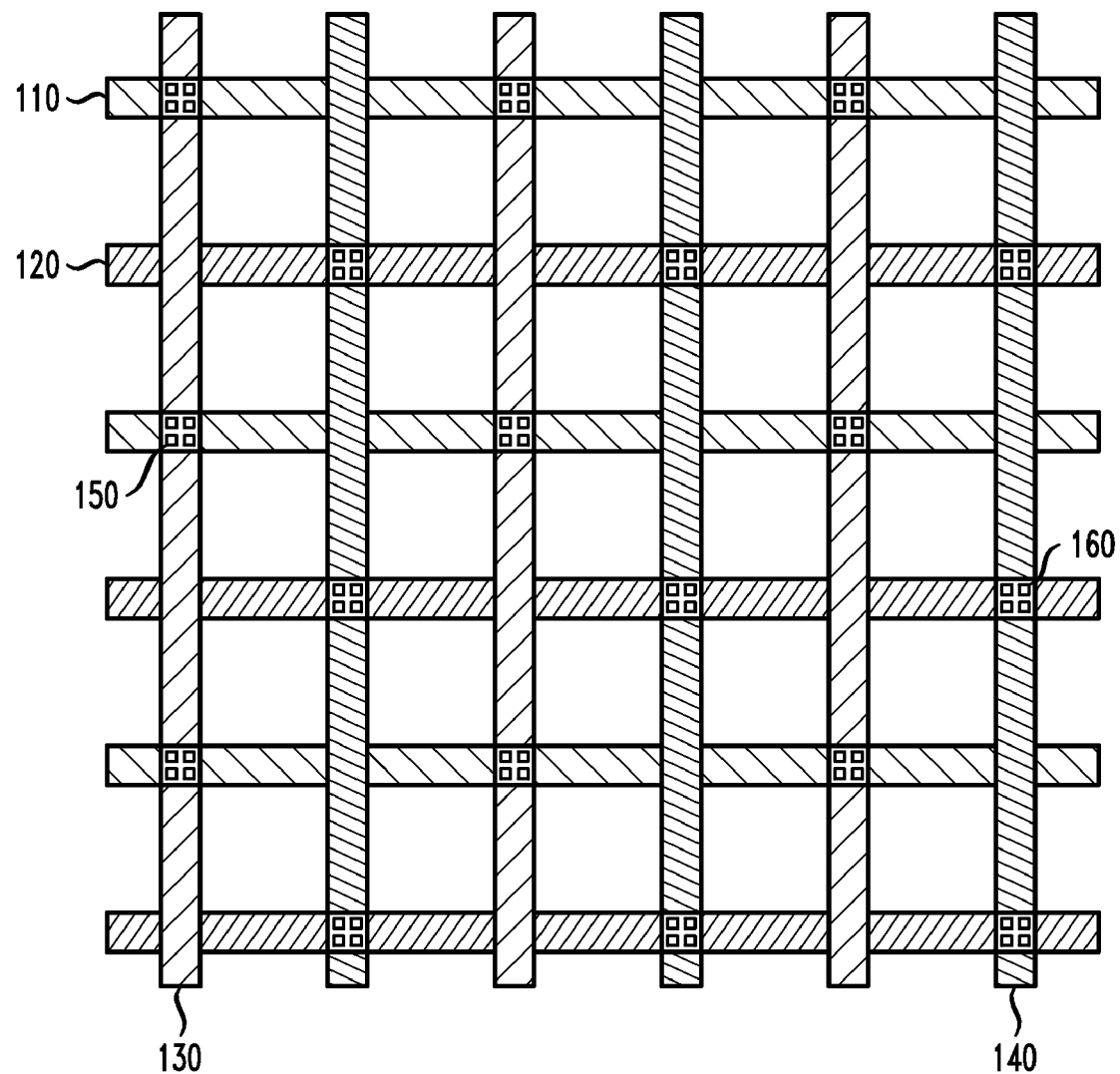
FIG. 1 is a top plan view depicting at least a portion of an illustrative power mesh layout in an IC suitable for use with techniques of the present invention.

The present invention will be described herein in the context of exemplary IC power distribution layouts and methods. It is to be understood, however, that the techniques of the present invention are not limited to the IC layouts and methods shown and described herein. Rather, embodiments of the invention are directed broadly to techniques for distributing power to standard cells in an IC in a manner which provides efficient use of space so as to reduce the required die area as compared to conventional IC designs. While embodiments of the invention will be described herein in the context of LBRAM circuits comprising latch standard cells, teachings of the invention are not limited to LBRAM circuits comprising latch standard cells. Alternative embodiments of the invention may be directed to other types of standard cells in place of or in addition to LBRAM and latch standard cells, such as, for example, digital circuitry (e.g., logic circuits, flip-flops, shift registers, etc.), analog circuitry (e.g., amplifiers, voltage and current references, etc.), mixed digital-analog circuitry (e.g., timing circuits, analog-to-digital converters, digital-to-analog converters, etc.), memory, and other circuitry that may be found in a standard cell library. Moreover, although preferred embodiments of the invention may be fabricated in a silicon wafer, embodiments of the invention can alternatively be fabricated in wafers comprising other materials, including but not limited to gallium arsenide (GaAs), indium phosphide (InP), etc.

The term "latch" as used herein is intended to be used synonymously with the term "latch standard cell." The term "standard cell" as used herein is intended to refer broadly to functional blocks with known electrical characteristics, such as, for example, propagation delay, input and output impedance, capacitance and inductance. A standard cell design is essentially the utilization of these functional blocks to achieve very high gate count with predictable electrical performance, and with reduced design cycle time compared to full custom designs. Standard cell methodology is an example of design abstraction, whereby a low-level very large scale integration (VLSI) layout is encapsulated into an abstract logic representation (e.g., a NAND gate).

An exemplary LBRAM typically comprises one or more bit lines and an array of latch standard cells surrounded by logic standard cells coupled to the bit lines to selectively read data from and write data to the array. Although an LBRAM may comprise standard cells, the LBRAM itself may be considered a standard cell, notwithstanding that the LBRAM may be compiled, for example, using a memory compiler, or an alternative computing means.

The latch standard cells in a LBRAM may be organized into one or more groups, with all latch standard cells in a given group connected to a common bit line. However, the bit line preferably uses standard voltage levels, such as, for example, VDD and VSS, to represent a logic "1" or "0" data state; therefore, a logic standard cell can be connected to the bit line to read the data. This reduces the area overhead occupied by the memory since specialized sense amplifiers are not required, as in the case of a SRAM. For small memories, the area of a LBRAM is typically much smaller than a comparable SRAM. Furthermore, since the latch standard cells are quite similar to logic standard cells, and a full voltage swing is used on the bit lines, LBRAMs are not susceptible to any more defects than logic standard cells. Consequently a low area overhead test scheme can be used to test LBRAMs, thereby avoiding BIST logic overhead. The result is that LBRAMs are typically smaller than comparable SRAMs, particularly at memory sizes up to approximately 8K (8192) total data bits.

The latch standard cells and the logic standard cells in a LBRAM may be arranged in rows, termed standard cell rows, with two common power rails, or alternative connection structures, running along the top and bottom of the standard cells. A first rail is utilized for providing a connection to a supply voltage, which may be VDD, and a second rail is utilized for providing a connection to a voltage return of the circuit, which may be ground or VSS. VDD is preferably a positive voltage (e.g., 1.0 volt), and VSS is typically zero volt, or alternatively a negative voltage. The power rails are typically implemented in a first electrically conductive layer, which may be a "metal 1" (M1) interconnect layer. The VDD and VSS rails are separately connected to the appropriate respective power supplies, such as, for example, through higher layers of metal (e.g., "metal 2" (M2), or higher). One means of connecting the VDD and VSS rails to their respective voltage supplies is to use a power mesh, or alternative connection arrangement, as will be described in further detail with reference to FIG. 1.

FIG. 1 is a top plan view depicting at least a portion of an illustrative power mesh layout 100 in an IC suitable for use with techniques of the present invention. Power mesh layout 100 preferably includes a plurality of conductive traces 110, 120, 130 and 140, or alternative conductive structures, substantially equally spaced from one another and running both horizontally and vertically. There are separate conductive traces for both VDD and VSS. The vertical conductive traces 130 and 140 are preferably implemented in one layer of metal interconnect (e.g., M1) while the horizontal conductive traces 110 and 120 are preferably implemented in a different metal layer (e.g., M2). One metal layer is higher or lower, with respect to a plane parallel to the surface of the chip, than another metal layer. Moreover, the respective metal layers are electrically isolated from one another, such as by forming a dielectric layer (e.g., silicon dioxide) between adjacent metal layers.

As referred to herein, the metal 1 layer (M1) is generally the lowest metal layer in an IC; that is, M1 is the metal layer closest to a substrate on which the metal layers are formed. The metal 2 layer (M2) is the metal layer formed above M1 without any other metal layer between M1 and M2. Likewise, metal 3 layer (M3) is the next metal layer formed above M2 without any other metal layer between M2 and M3. The progression of metal layers continues in this fashion until a top metal layer is formed, for example, M8 formed above M7 without any other metal layer between M7 and M8. It is to be understood that the invention is not limited to any specific number of metal layers. Via arrays 150 and 160, or alternative connection structures, may be used to connect the appropriate vertical and horizontal conductive traces, preferably at an intersection of a horizontal conductive and a vertical conductive trace, as shown. A "via," as the term is used herein, is intended to refer broadly to a conductive structure providing electrical connection between different metal layers in an IC.

More particularly, power mesh layout 100 comprises horizontal VDD traces 110, vertical VDD traces 130, horizontal VSS traces 120, vertical VSS traces 140, VDD via array 150 coupling horizontal VDD traces 110 to vertical VDD traces 130, and VSS via array 160 coupling horizontal VSS traces 120 to vertical VSS traces 140. Each of VDD and VSS via arrays 150 and 160, respectively, comprises one or more vias. The number of vias employed in a given via array may be a function of a width, or alternative characteristic(s), of the conductive traces that are being connected. Furthermore, although shown as being arranged in a substantially grid-like configuration, the plurality of vias in a given via array need not be formed in such a manner. Horizontal VDD traces 110 and horizontal VSS traces 120 are preferably formed with M7, with vertical VDD traces 130 and vertical VSS traces 140 formed with M8. Of course, it is to be appreciated that the invention is not limited to any specific metal layers in which the VDD and VSS traces are formed. Furthermore, although shown as being arranged in substantially horizontal and vertical orientations, the conductive traces 110, 120, 130, 140, may be arranged in other orientations, such as, for example, diagonally.

Figure 2:
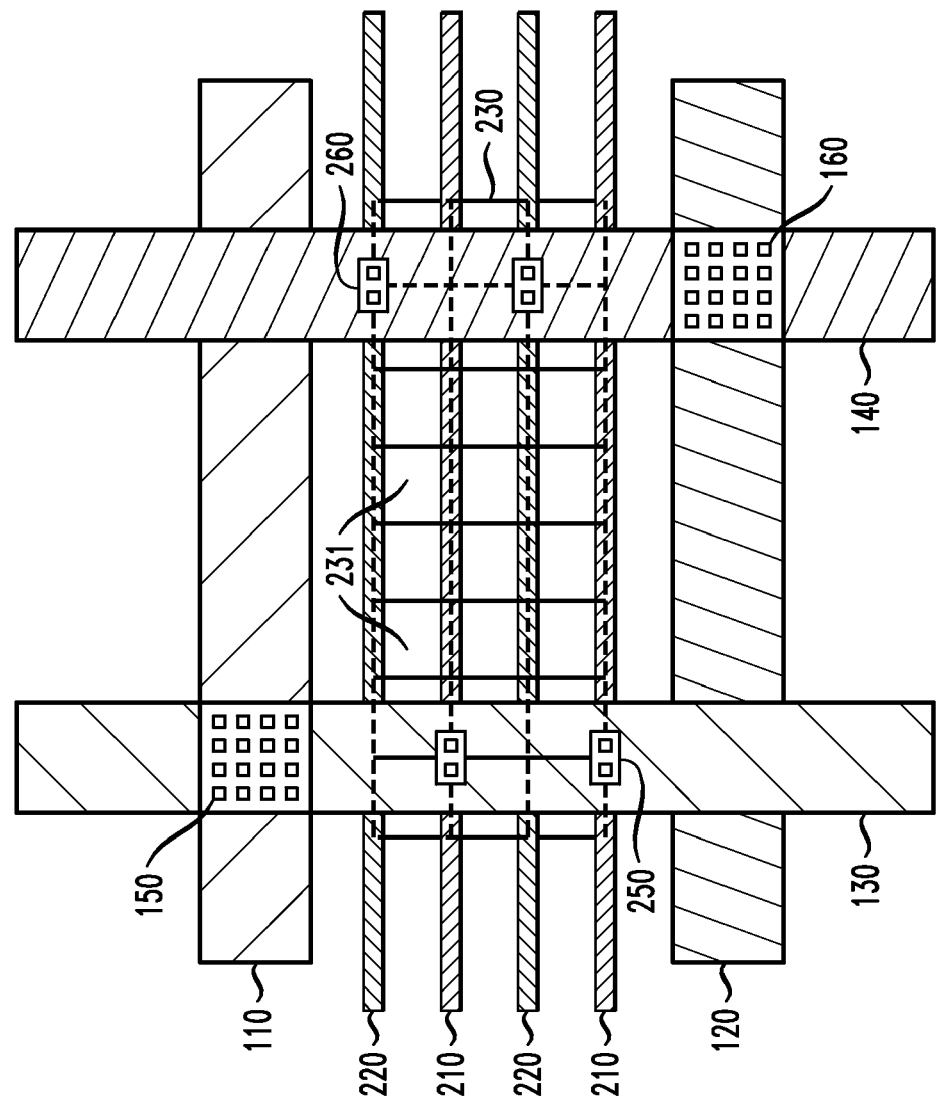
FIG. 2 is a top plan view depicting at least a portion of an illustrative power mesh connection structure for connecting a power mesh with standard cells in an IC, according to an embodiment of the present invention.

FIG. 2 is a top plan view depicting at least a portion of an illustrative power mesh power connection structure 200 for connecting a power mesh with standard cells formed on a substrate in an IC, according to an embodiment of the present invention. Power mesh power connection structure 200 preferably includes at least a portion of power mesh 100 shown in FIG. 1, such as, for example, portions of horizontal VDD trace 110, vertical VDD trace 130, horizontal VSS trace 120, vertical VSS trace 140, VDD via array 150, and VSS via array 160. Power mesh power connection structure 200 further comprises a standard cell array 230 including one or more standard cells 231.

In one embodiment, the standard cells 231 are LBRAM latch standard cells. In a second embodiment, the standard cells 231 are LBRAM latch standard cells and logic standard cells. In other embodiments, the standard cells 231 comprise other standard cell types having other corresponding functions, including, for example, digital circuitry (e.g., logic circuits, flip-flops, shift registers, etc.), analog circuitry (e.g., amplifiers, voltage and current references, etc.), mixed digital-analog circuitry (e.g., timing circuits, analog-to-digital converters, digital-to-analog converters, etc.), memory, and other circuitry that may be found in a standard cell library. The standard cells 231 need not be identical to one another. In some embodiments, the standard cells are not arranged in an array but are a group of standard cells arranged in one or more rows with or without spaces between standard cells within a given row.

Power mesh power connection structure 200 further includes VDD power rails 210 and VSS power rails 220. VDD power rails 210 and VSS power rails 220 are preferably formed using one or more metal layers below the metal layers used for VDD traces 110 and 130, and VSS traces 120 and 140. By way of example only and without loss of generality, VDD power rails 210 and VSS power rails 220 are formed in layer M1.

Connection from the power mesh, which includes horizontal VDD trace 110, vertical VDD trace 130, horizontal VSS trace 120, vertical VSS trace 140, VDD via array 150, and VSS via array 160, to the VDD power rails 210 and VSS power rails 220 is preferably made using one or more first stacks of vias 250 and one or more second stacks of vias 260, respectively. More particularly, a first stack of vias 250 is preferably formed at an intersection between a vertical VDD trace 130 and a given VDD power rail 210. Similarly, a second stack of vias 260 is preferably formed at an intersection between a vertical VSS trace 140 and a given VSS power rail 220. A cross section of an exemplary stack of vias suitable for use in implementing stack of vias 250 and/or 260 is described in further detail below in conjunction with FIG. 3.

Figure 3:
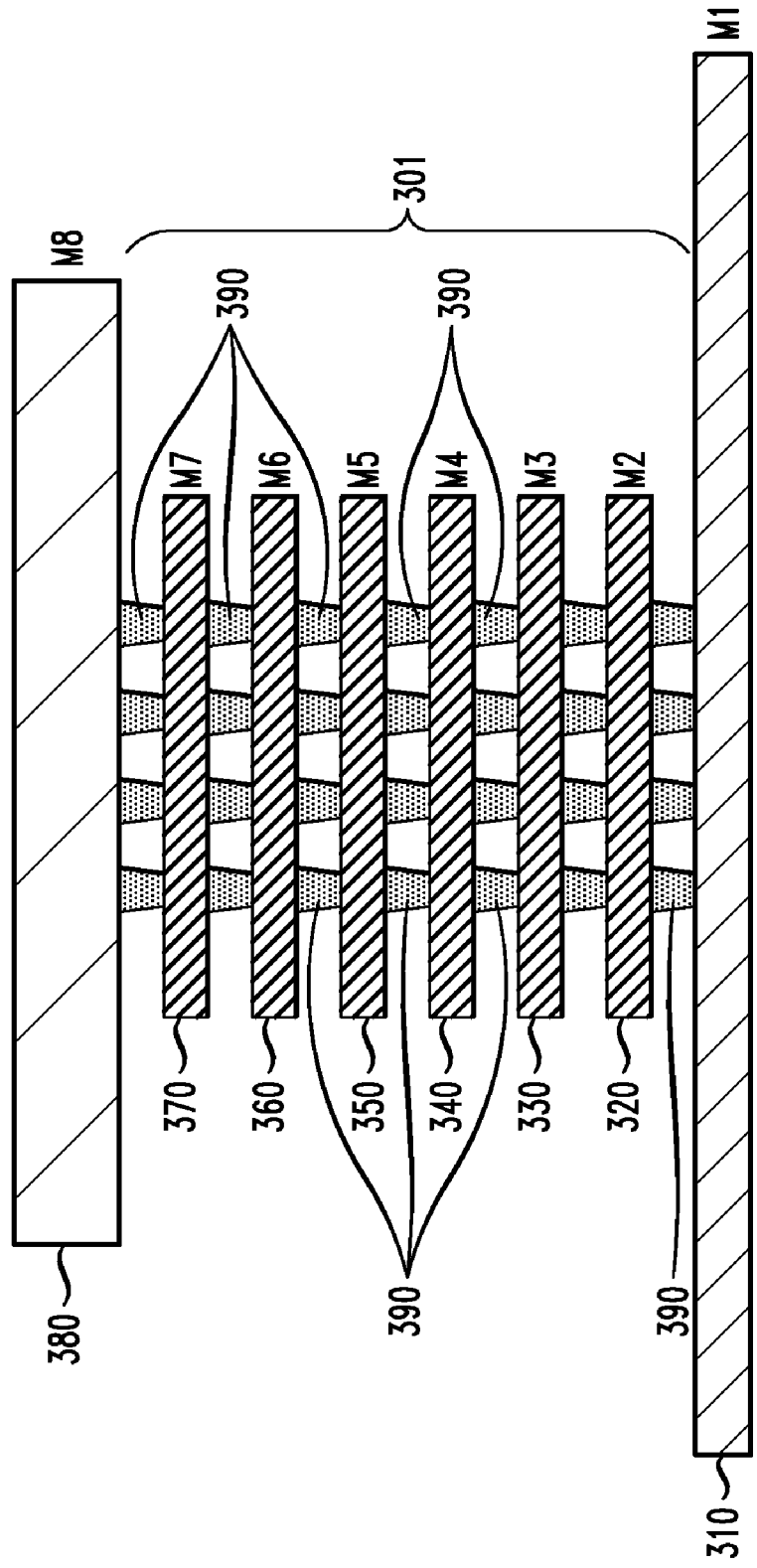
FIG. 3 is a cross-sectional view depicting at least a portion of an illustrative stack of vias connecting two conducting layers in an IC.

FIG. 3 is a cross-sectional view 300 depicting at least a portion of an exemplary stack of vias 301 connecting two conducting layers in an IC. In this example, the stack of vias 301 comprises a set of four vias 390 between each pair of adjacent metal layers. It is to be understood, however, that the invention is not limited to any particular number of vias formed between a given pair of metal layers. The stack of vias 301 connects a high level metal conductor 380, which may be formed in a M8 metal layer, to a low level metal conductor 310, which may be formed in a M1 metal layer. The high level metal conductor 380 may be, for example, VDD trace 110 or 130, or VSS trace 120 or 140 shown in FIG. 1. The low level metal conductor 310 may be, for example, VDD power rail 210 or VSS power rail 220 shown in FIG. 2. The stack of vias 301 comprises conductors on all the intervening metal layers between low level metal conductor 310 and high level metal conductor 380.

More particularly, in the illustrative stack of vias 301, the high level metal conductor 380 is formed within M8, the low level metal conductor is formed within M1, and the intervening metal layers conductors 320, 330, 340, 350, 360 and 370 are formed within metal layers M2, M3, M4, M5, M6, and M7, respectively. As previously mentioned, the stack of vias 301 comprises vias 390 formed between the conductors on each adjacent metal layer, that is, between low level metal conductor 310 and M2 conductor 320, between M2 conductor 320 and M3 conductor 330, between M3 conductor 330 and M4 conductor 340, between M4 conductor 340 and M5 conductor 350, between M5 conductor 350 and M6 conductor 360, between M6 conductor 360 and M7 conductor 370, and between M7 conductor 370 and high level metal conductor 380. In other embodiments, stack of vias 301 may comprise conductors within more or fewer metal layers and terminate on conductors within metal layers other than M1 and M8, for example M2 or M3.

Key aspects of LBRAM design include write margin and read margin. The write margin may be defined as a quantitative measurement of how much the voltage levels of the control signals supplied to the latch cell can deviate from prescribed nominal levels and still allow data to be written properly into the latch cell. Similarly, the read margin may be defined as a quantitative measurement of how much the control signal levels can deviate from prescribed nominal levels and still have data read properly from the latch cell. An LBRAM with good (i.e., relatively large) read and write margins can tolerate a significant deviation of the control signal levels and still function properly. This, in turn, will allow a chip, that includes LBRAMs, to function under a wide range of environmental conditions, and even possibly function with minor manufacturing defects. The read and write margins are also an indication of a level of signal integrity in the LBRAM.

As mentioned above, LBRAMs have an area advantage over their SRAM counterparts having a relatively small number of memory cells. However, even when using LBRAMs, it is advantageous to reduce LBRAM area as much as possible, thereby reducing die area and die cost. It is typical to have dense signal routing in metal layer M2 above the standard cells (e.g., 231 in FIG. 2), including latch standard cells. Dense signal routing typically comprises metal traces and required spaces between the metal traces to prevent shorting between the metal traces. With reference again to FIG. 2, if the standard cells 231 in a standard cell array 230 or a row of standard cells are placed as densely as possible (e.g., abutting one another with no spaces between adjacent cells), dense signal routing in M2 signal traces typically will substantially use all available M2 routing space above the standard cell, standard cell row, or standard cell array. As a result, there would be no room to insert one or more VDD stacks of vias 250 to connect the M1 VDD power rails 210 to the higher metal level VDD traces 130 of the power mesh. Likewise, there would be no room to insert one or more VSS stacks of vias 260 to connect the M1 VSS power rails 220 to the higher level VSS traces 140 of the power mesh. Stacks of vias 250 or 260 typically comprise a row or an array of vias that are multiple vias wide in a direction parallel to the power rails 210 and 220. In this instance, the standard cells 231 are placed less densely to allow room for the stacks of vias 250 and 260, thereby increasing the overall standard cell or LBRAM area. For example, to allow room for the stack of vias 250 or 260, a space is placed between two standard cells 231. M2 signal traces will not be placed over this space so that there is room for intervening metal layer conductors (e.g., 320 shown in FIG. 3) that are part of the stack of vias 250 or 260.

Figure 4:
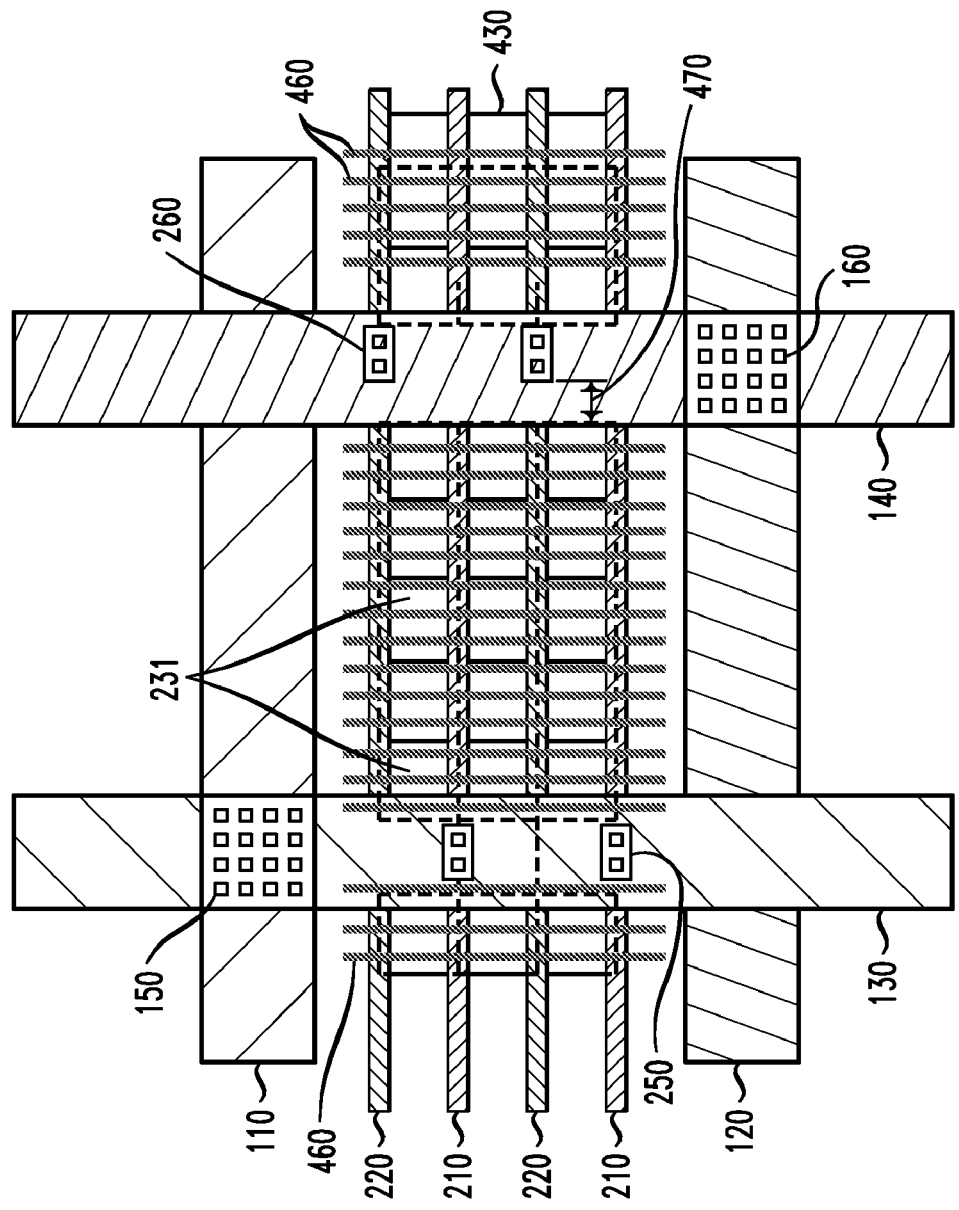
FIG. 4 is a top plan view depicting at least a portion of an illustrative connection of a power mesh to standard cells in an IC requiring a prescribed separation between adjacent standard cells.

One configuration to connect the standard power cell rails 210 and 220 to the power mesh 100 in standard cells and LBRAMs is to use a power distribution configuration as shown in FIG. 4. With reference to FIG. 4, a top plan view is shown depicting at least a portion of an exemplary connection arrangement 400 for connecting a power mesh to one or more standard cells 231 in an IC requiring a prescribed separation between adjacent standard cells. The standard cells 231 within a standard cell array 430 are separated horizontally, thereby providing spaces between the standard cells where vertical power traces 130 and 140 overlay the standard cells. The width of the spaces between the cells is preferably sufficient to allow stacks of vias 250 and 260 to connect the vertical power traces 130 and 140, respectively, to corresponding power rails 210 and 220. Connection arrangement 400 includes a plurality of signal conductors 460 arranged substantially parallel to one another. As apparent from the figure, there are spaces between signal conductors 460 allowing placement of the intervening metal layer conductors that are part of the stacks of vias 250 and 260.

As previously explained, spreading the standard cells 231 in the standard cell array 430 to allow room for stacks of vias 250 and 260 has the disadvantage of increased standard cell array area. This, in turn, leads to increased chip die area and increased chip die cost, which is undesirable.

The placement of standard cells along a cell row is typically constrained so that left and right edges of a given standard cell 231 fall on an evenly spaced grid line. The spacing is often referred to as the grid size. The widths of standard cells are typically restricted to be a multiple of the grid size.

By way of example only, an illustrative LBRAM may be implemented with a grid size of 0.28 micron (μm), and with a power mesh having vertical conductors of alternating VDD traces 130 and VSS traces 140 with a center-to-center spacing between adjacent VDD and VSS traces of 59.92 μm. The connection from the power mesh to the M1 rails is preferably made using a stack of four vias, where the vias are arranged horizontally. To provide room on layer M2 for the stack of four vias, a gap of at least 6 grids (i.e., 1.68 μm) is required in which no standard cell 231 may occupy. The absence of standard cells 231 in the gap ensures that no M2 signal traces 460 will be present in the gap. There are thirty-two LBRAM latch standard cells 231 of width 2.8 μm each arranged in a row having a width of 89.6 μm before any gap is inserted between latch standard cells 231 within the row. The LBRAM latch standard cells 231 can be placed at any offset to the power mesh, so LBRAM latch standard cells 231, having a total width 89.6 μm, may have been placed under a total of one or two VDD traces 130 or VSS traces 140, having a center-to-center spacing of 59.92 μm. Furthermore, depending on the offset to the stacks of vias 250 or 260, the row of latch standard cells may require a gap of more than the minimum 6 grid width.

If a distance, d, 470 between an edge of a latch standard cell 231 in a row and the required gap under the power trace (e.g., 140) is less than the width of the latch standard cell 231, then the row of latch standard cells must be opened by an extra width equal to at least d to avoid a standard cell 231 from falling within the M2 area occupied by the stacks of vias 250 or 260. This demonstrates the common occurrence where the vertical power traces (e.g., 130, 140) are spaced at a fixed distance and latch standard cells 231 are placed starting at the stacks of vias corresponding to the vertical power traces, such as stack of vias 250 coupled to VDD trace 130, and abutting one another. When placement of the latch standard cells 231 approaches VSS trace 140, there is not enough room for placement of another latch standard cell, and a gap of distance d results. This means the required gap for one stack of vias 250 or 260 could be increased by the width of the latch standard cell 231 minus one grid. In this example, the latch is 10 grids wide, so the extra spreading could be up to 9 grid widths wide. Thus, the spacing between latch standard cells 231 for one power trace 130 or 140 is anywhere between 6 and 15 grid widths. For the LBRAM latch standard cells 231 in this example, since there may be one or two gaps required, the total gap width is between 6 and 30 grid widths; that is, between 1.68 μm and 8.4 μm. This represents an increase in area of up to about 9.4 percent. In a typical design, the increase in LBRAM area is an average of about 5 percent.

In a second example, a grid size of 0.2 μm and a power mesh VDD/VSS trace center-to-center spacing of 25 μm is assumed. Connections from the power mesh to the M1 VDD and VSS power rails 210 and 220, respectively, preferably utilize stacks of vias 250 and 260 that include stacks of 4 vias having a width of 5 grids (i.e., 1.0 μm). Therefore, there is a width of 24 μm between the VDD/VSS traces 130 and 140 where latch standard cells 231 can be placed. Assuming latch standard cells 231 are each 13 grids wide (i.e., 2.6 μm), nine latch standard cells, having a width of 23.4 μm, can be placed between adjacent power traces 130 and 140. If the offset from the latch standard cell row to the first VDD/VSS trace is controlled so that the minimum spreading gap of 1.0 μm is used, the gap to the next VDD/VSS trace will require a gap of an additional 0.6 μm. Therefore, 1.6 μm is the maximum total gap width that will be required for this example. The minimum total gap width will correspond to the power mesh aligned to the row of latch standard cells so that only one gap is required, and where the minimum gap width is 1.0 μm. Therefore, the total gap width will vary between 1.0 μm and 1.6 μm. A gap is needed for every 25 μm of width, so this represents an increase in die area of about 4 percent to 6.4 percent.

In general, spreading the latch cells in the array causes an increase in LBRAM area of approximately 5 percent. For a typical design where LBRAMs comprise about 20 percent of the total chip area, this represents an increase in overall die area of approximately 1 percent. The increase in die area directly increases the cost of manufacturing by a little more than approximately 1 percent. This cost increase is significant for designs where the profit margin is already low.

Another issue involving the use of power connections which employ stacks of vias is that the resistance of a given stack of vias is generally higher than the resistance of the power traces. For example, for a power mesh comprising M8 VDD/VSS vertical traces 130 and 140 and M9 VDD/VSS horizontal traces 110 and 120, a stack of vias (e.g., 301 shown in FIG. 3) connecting M8 vertical VDD/VSS traces 130 and 140 to M1 VDD/VSS power rails 210 and 220 comprises seven levels of stacked vias. The large number of levels of stacked vias contributes to the relatively high resistance of the stack of vias, since the respective resistances of the interconnection points add together in series.

Figure 5A:
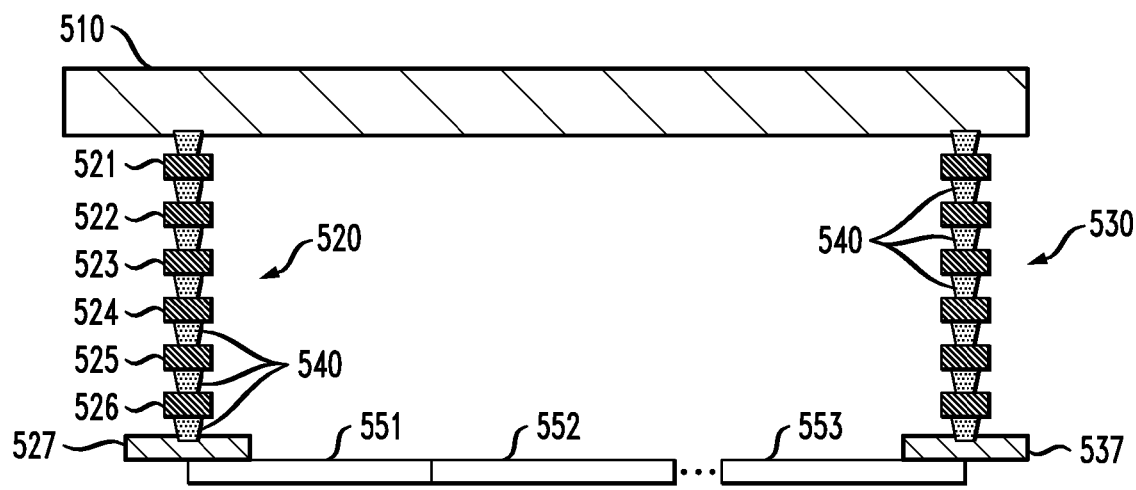
FIGS. 5A and 5B show a cross-sectional view and corresponding schematic diagram, respectively, relating to the illustrative power mesh connection shown in FIG. 4.
Figure 5B:
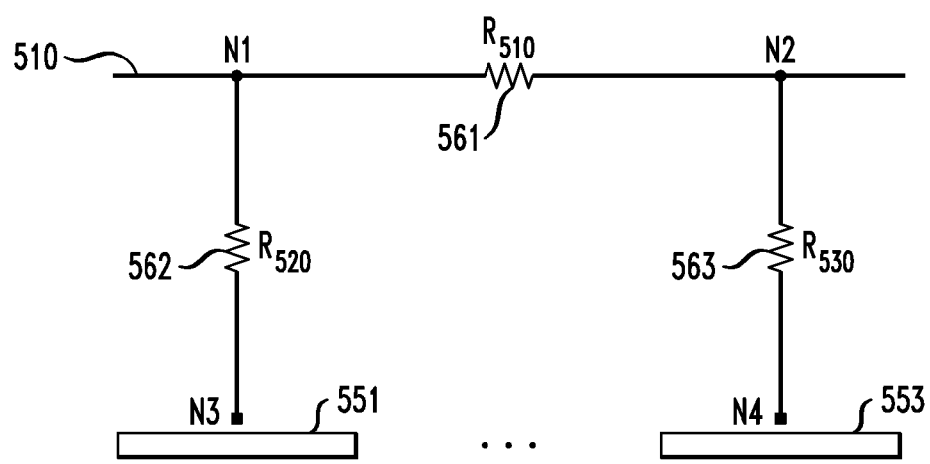

FIGS. 5A and 5B show a cross-sectional view 500 and corresponding schematic diagram, respectively, relating to the illustrative power mesh connection arrangement 400 shown in FIG. 4. FIG. 5A depicts a VDD/VSS trace 510 connected to a lower layer conductor 527 coupled to a first standard cell 551 by way of a first stack of vias 520. Likewise, VDD/VSS trace 510 is connected to a lower layer conductor 537 coupled to a second standard cell 553 by way of a second stack of vias 530. Other standard cells (e.g., 552) may be connected to the same or alternative voltage supply rails in a similar manner. Each of the stacks of vias 520 and 530 preferably includes a plurality of conductive traces, such as, for example, metal traces 521, 522, 523, 524, 525 and 526, each formed in a separate conductive layer (e.g., metal layers M7 through M2, respectively), with metal traces in adjacent conductive layers being connected to one another by one or more conductive vias 540.

FIG. 5B illustrates a schematic representation of the connection arrangement 400 of FIG. 5A. Resistor 561 having a resistance $R_{510}$ represents the resistance of VDD/VSS trace 510, resistor 562 having a resistance $R_{520}$ represents the resistance of the first stack of vias 520, and resistor 563 having a resistance $R_{530}$ represents the resistance of the second stack of vias 530. The relatively large resistances $R_{520}$ and $R_{530}$ of stacks of vias 520 and 530, respectively, when compared to the resistance $R_{510}$ of VDD/VSS trace 510 (FIG. 5A), can lead to a significant difference in the power supply voltage levels between the respective standard cells 551, 552, 553 and the VDD/VSS power rails. The amount of current through each stack of vias 520 and 530 may be quite different due, at least in part, to different types and numbers of standard cells 551, 552 and 553 connected to the two different stacks of vias 520 and 530. The difference in current leads to a significant difference in voltage across the two stacks of vias 520 and 530.

Since there is less resistance $R_{510}$ associated with the M8 VDD/VSS trace 510 than with the resistances $R_{520}$ and $R_{530}$ of the stacks of vias 520 and 530, respectively, the voltage difference between a first node, N1, connecting the first stack of vias 520 with VDD/VSS trace 510, and a second node, N2, connecting the second stack of vias 530 with the VDD/VSS trace will be relatively small in comparison to the voltage drop across a given stack of vias. Therefore, a significant voltage differential will appear between a third node, N3, connecting the first stack of vias 520 with the first standard cell 551, and a fourth node, N4, connecting the second stack of vias 530 with the second standard cell 553. The end result is that there is a relatively large power supply voltage differential between standard cell 551 at node N3 and standard cell 553 at node N4 (e.g., between latch standard cells at the top of an array and latch standard cells at the bottom of the array). Assuming the power supply is about 1.0 volt, the voltage differential between standard cells at the two locations may be as high as about 50 millivolts (mV).

In an LBRAM, standard cells driving the control signals to the latch standard cells 231 are typically placed at the top of an array, so there may be a power supply differential typically as high as 50 mV between these driving standard cells and the latch standard cells 231 at the bottom of the array. Wherever the driving standard cells are placed, there may be a power supply differential typically as high as 50 mV to either the latch standard cells 231 at the top of the array or to the latch standard cells 231 at the bottom of the array. This power supply voltage differential has a direct effect of reducing the read and write margins in the LBRAM, and reducing the level of signal integrity in the LBRAM, or alternative standard cell circuit.

FIG. 6 is a simplified block diagram depicting at least a portion of an exemplary LBRAM 600, according to an embodiment of the present invention. LBRAM 600 comprises a latch array 610 including a plurality of latch standard cells 231 arranged in four rows and eight columns. It is to be appreciated that the invention is not limited to the specific arrangement of array 610. For example, array 610 may comprise any number of rows and any number of columns. Moreover, the latch standard cells 231 need not be arranged in columns and rows, but may be arranged in an alternative orientation, such as, for example, diagonally.

A plurality of column conductive traces 612 and row conductive traces 613 are included in LBRAM 600, with each latch standard cell 231 coupled to a corresponding unique pair of row and column traces. LBRAM 600 further comprises an address decoder 620 and a plurality of drivers 630, an input of each driver being coupled to a corresponding output of the address decoder and an output of each driver being coupled to a corresponding column trace 612. Each row trace 613 corresponds to a bit (e.g., data bit) within a word (e.g., data word) in the LBRAM 600. There are four row traces 613 shown in the figure; therefore, there are four bits within a given word. In this arrangement, a row trace 613 may be termed a bit line. Each column trace 612 corresponds to a word. There are eight column traces 612 shown in the figure; therefore, there are eight words, each comprising four bits. In this arrangement, a column trace 612 may be termed a word line.

The address decoder 620 activates at most one driver 630 at any given time. When a driver 630 is activated, the corresponding column trace 612 and the latch standard cells 231 within that column are activated, thereby enabling the bits within the word associated with that column to be either read or written. Only one latch standard cell 231 on a given bit line will be active at a time. Alternatively, it is possible to configure the LBRAM 600 so that rows become columns and columns become rows. In this case, there would be one bit associated with each column and one word associated with each row. Operation of an LBRAM array is known in the art, and therefore a more detailed description of such operation will be omitted herein.

Figure 7:
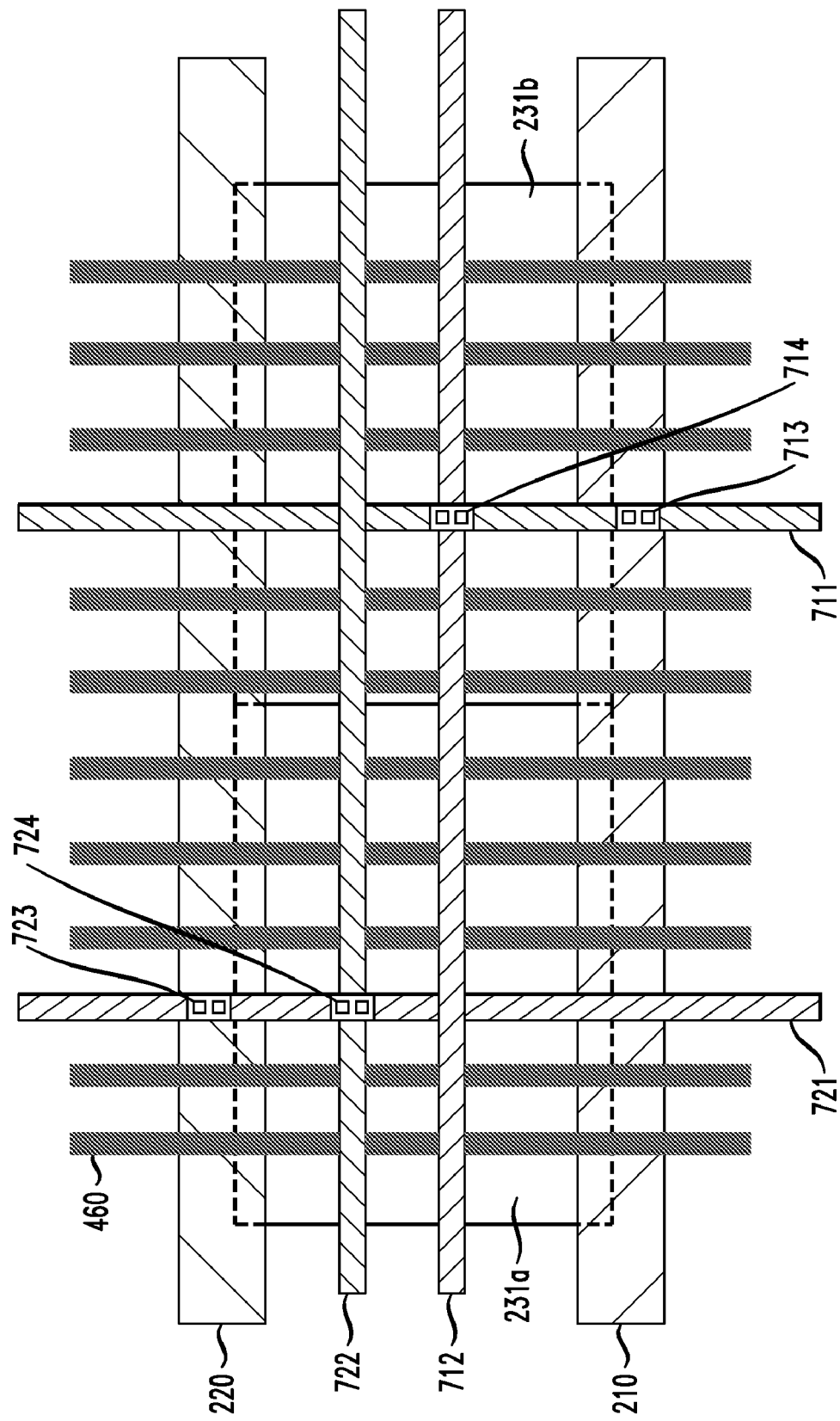
FIG. 7 is a top plan view depicting at least a portion of an exemplary power connection layout for providing power to latches of an LBRAM, or to alternative standard cells, according to an embodiment of the present invention.

FIG. 7 illustrates a power connection structure 700 providing power to latch standard cells 231a and 231b of an LBRAM, or alternatively (or in addition) to other standard cells, according to an embodiment of the invention. The power connection structure 700 comprises two standard cells 231a and 231b, which may be latch standard cells. Standard cells 231a and 231b may be a portion of a larger composition of standard cells, for example, a row or an array of latches or other standard cells, and the power connection structure 700 may be part of a larger power connection structure. The power connection structure 700 further comprises M1 layer VDD power rails 210 and M1 layer VSS power rails 220. VDD power rails 210 and VSS power rails 220 supply power to the standard cells 231a and 231b. M2 layer signal conductors (runners) 460 are preferably not considered part of power connection structure 700, but are shown for completeness.

As previously mentioned, the signal conductors 460 typically will use substantially all available M2 routing space overlying the standard cells 231a and 231b. However, in the embodiment shown, there are two M2 routing tracks not occupied by M2 signal conductors 460. Instead, these two M2 routing tracks are occupied by a vertical M2 layer VDD trace 711 and a vertical M2 layer VSS trace 721. The power connection structure 700 comprises the vertical M2 VDD trace 711, the vertical M2 VSS trace 721, and further includes a horizontal M3 layer VDD trace 712, a horizontal M3 layer VSS trace 722, M2 to M1 VDD vias 713, M3 to M2 VDD vias 714, M2 to M1 VSS vias 723, and M3 to M2 vias 724. The horizontal M3 VDD trace 712 is coupled to the vertical M2 VDD trace 711 by M3 to M2 VDD vias 714. The vertical M2 VDD trace 711 is coupled to the M1 VDD power rail 210 by M2 to M1 VDD vias 713. Likewise, the horizontal M3 VSS trace 722 is coupled to the vertical M2 VSS trace 721 by M3 to M2 VSS vias 724. The vertical M2 VSS trace 721 is coupled to the M1 VSS power rail 220 by M2 to M1 VSS vias 723. In this manner, electrical connection is made for VDD and VSS power distribution from the M3 VDD trace 712 to the standard cells 231a and 231b, and electrical connection is made from the M3 VSS trace 722 to the standard cells 231a and 231b.

It is to be understood that M2 to M1 VDD vias 713 may comprise one or more vias (e.g., a stack of vias), M3 to M2 VDD vias 714 may comprise one or more vias, M2 to M1 VSS vias 723 may comprise one or more vias, and M3 to M2 vias 724 may comprise one or more vias.

In order to minimize the width of vertical M2 VDD trace 711, and therefore minimize the displacement of M2 signal conductors 460, it is advantageous to place only one via 713, or multiple vias stacked one via wide, along vertical M2 VDD trace 711, as shown, to form an interconnection between the M1 VDD power rail 210 and the vertical M2 VDD trace 711. In an illustrative embodiment of the invention, vertical M2 VDD trace 711 comprises a rectangular metal conductor that is less than about 0.22 μm wide, and an upper metal layer vertical VDD trace (e.g., 130 in FIG. 4) is wider, for example, at least three times as wide as the vertical M2 VDD trace 711.

The embodiment shown in FIG. 7 comprises one vertical M2 VDD or VSS trace, either a M2 VDD trace 711 or a M2 VSS trace 721, over each column comprising either standard cell 231a or standard cell 231b. The embodiment also comprises two horizontal M3 VDD and VSS traces, one M3 VDD trace 712 and one M3 VSS trace 722, over each row comprising standard cells 231a and 231b. However, the invention is not so limited; any number, including zero, of vertical VDD and VSS M2 traces over a column of standard cells, and any number, including zero, of horizontal M3 VDD and VSS traces over a row of standard cells is contemplated by the invention. Furthermore, the horizontal VDD and VSS traces need not alternate between VDD and VSS, and, similarly, the vertical VDD and VSS traces need not alternate between VDD and VSS (although this arrangement is preferred in both cases in order to minimize the span between adjacent VDD traces or adjacent VSS traces).

Alternative embodiments may have different numbers, including fractional numbers, of VDD and/or VSS traces per standard cell row and different numbers, including fractional numbers, of VDD and/or VSS traces per standard cell column, as long as there is at least one higher level metal VDD trace, for example, M3 VDD trace 712, and at least one higher level metal VSS trace, for example, M3 VSS trace 721, that couple to at least one lower level metal VDD trace, for example, M2 VDD trace 711, and at least one lower level metal VSS trace, for example, VSS trace 721, respectively, that, in turn, couples to the VDD power rail 210 and VSS power rail 220, respectively, associated with each row of standard cells. The higher level VDD and/or VSS traces may be accessible for connection to a conductor formed using an even higher metal level. FIG. 7 shows M3 to M2 VDD vias 714, M2 to M1 VDD vias 713, M3 to M2 VSS vias 724, and M2 to M1 VSS vias 723 each comprising two vias. However, it is to be appreciated that the invention is not limited to any particular number of vias employed. In alternative embodiments, M3 to M2 VDD vias 714, M2 to M1 VDD vias 713, M3 to M2 VSS vias 724, and M2 to M1 VSS vias 723 each may comprise one or more vias.

Figure 8:
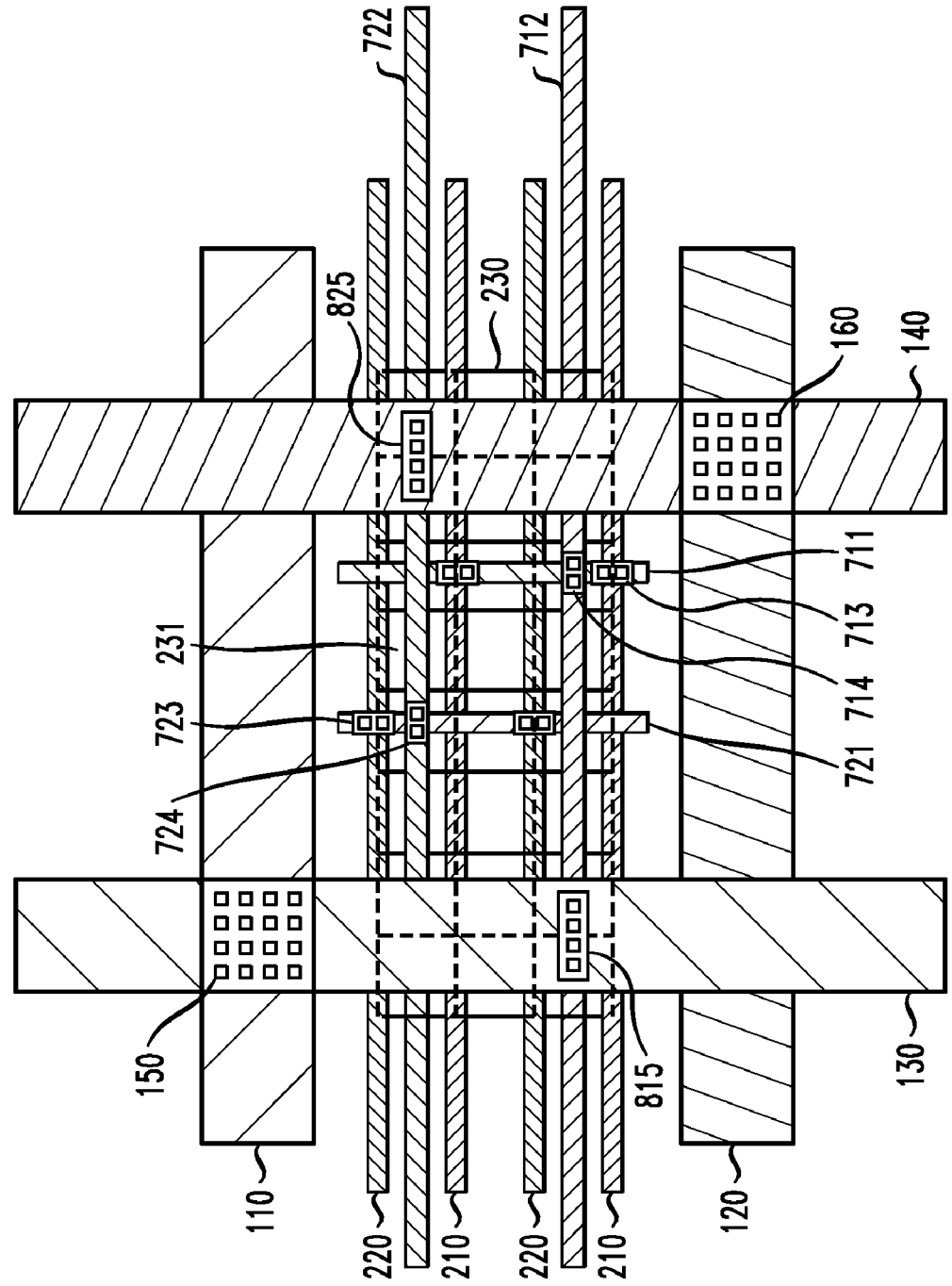
FIG. 8 is a top plan view depicting at least a portion of an exemplary extended power connecting layout, according to an embodiment of the present invention.

FIG. 8 is a top plan view depicting at least a portion of an exemplary extended power connecting structure 800, according to an embodiment of the present invention. Power connecting structure 800 is essentially an extension of the power connecting structure 700 shown in FIG. 7. More particularly, power connecting structure 800 preferably comprises all of the components of power connecting structure 700; that is, power connecting structure 800 preferably includes a standard cell array 230 comprising a plurality of standard cells 231, each of which may be representative of standard cell 231a or 231b shown in FIG. 7, M1 VDD power rails 210, M1 VSS power rails 220, vertical M2 VDD trace 711, vertical M2 VSS trace 721, horizontal M3 VDD trace 712, horizontal M3 VSS trace 722, M2 to M1 VDD vias 713, M3 to M2 VDD vias 714, M2 to M1 VSS vias 723, and M3 to M2 vias 724. Inasmuch as extended power connecting structure 800 comprises similar elements to the power connecting structure 700 depicted in FIG. 7, the description of these elements in conjunction with power connecting structure 700 is also applicable to the extended power connecting structure 800.

Power connecting structure 800 further comprises at least a portion of power mesh 100 (FIG. 1), namely, horizontal VDD trace 110, horizontal VSS trace 120, vertical VDD trace 130, vertical VSS trace 140, VDD via array 150, and VSS via array 160. The description and embodiments of horizontal VDD trace 110, horizontal VSS trace 120, vertical VDD trace 130, vertical VSS trace 140, VDD via array 150, and VSS via array 160 have been previously described in conjunction with the power mesh 100 shown in FIG. 1.

The extended power connecting structure 800 further comprises VDD via short stack 815 and VSS via short stack 825. Vertical VDD trace 130 is coupled to the horizontal M3 VDD trace 712 by VDD via short stack 815. Similarly, vertical VSS trace 140 is coupled to the horizontal M3 VSS trace 722 by VSS via short stack 825. Using this arrangement, VDD and VSS conveyed by the power mesh is coupled to horizontal M3 VDD and VSS traces 712 and 722, respectively. In this manner, as previously described with respect to power connecting structure 700 (FIG. 7), VDD and VSS is coupled down to standard cells 231 within the standard cell array 230.

Illustrative embodiments of the invention shown in FIGS. 7 and 8 have advantages in that the spacing of standard cells 231, as required in the power connection arrangement 400 illustrated in FIG. 4, is not required in order to couple VDD power to M1 VDD power rails 210 or to couple VSS power to VSS power rails 220. Rather, in a given standard cell row, each of the standard cells 231 is arranged in direct abutment with two other standard cells (i.e., with no spacing therebetween), with the exception of standard cells on either end of the standard cell array 230, which are in direct abutment with one standard cell. Using this approach, the increase in die area associated with the required spacing between adjacent standard cells in a conventional power connection arrangement can be beneficially eliminated. In the illustrative case of a LBRAM, for example, about a five percent reduction in chip area can be achieved, along with a corresponding decrease in chip cost, which is desirable.

FIG. 9 is a cross-sectional view depicting at least a portion of an exemplary via structure 900, according to an embodiment of the present invention. Via structure 900 comprises a short stack of vias 901 connecting two conductive layers in an IC. Short stack of vias 901 includes a set of four vias 540 between adjacent pairs of metal layers 940, 950, 960, and 970. It is to be appreciated that the invention is not limited to any particular number of vias formed between a given pair of metal layers. The stack of vias 901 connects a high level metal conductor 980, which may be formed in a M8 metal layer, to a low level metal conductor 930, which may be formed in a M1 metal layer. The high level metal conductor 980 may be, for example, VDD trace 110 or 130, or VSS trace 120 or 140, and the low level metal conductor 930 may be, for example, M3 VDD trace 712 or M3 VSS trace 722 shown in FIG. 8. The stack of vias 901 comprises conductors on all the intervening metal layers between low level metal conductor 930 and high level metal conductor 980.

More particularly, in the illustrative short stack of vias 901, the high level metal conductor 980 is formed within M8, the low level metal conductor 930 is formed within M3, and the intervening metal layers 940, 950, 960 and 970 are formed within metal layers M4, M5, M6 and M7, respectively. As previously mentioned, the short stack of vias 901 comprises vias 540 formed between the conductors on each adjacent metal layer, that is, between low level metal conductor 930 and M4 conductor 940, between M4 conductor 940 and M5 conductor 950, between M5 conductor 950 and M6 conductor 960, between M6 conductor 960 and M7 conductor 970, and between M7 conductor 970 and high level metal conductor 980. In other embodiments, stack of vias 901 may comprise conductors within more or fewer metal layers and terminate on conductors within metal layers other than M3 and M8, for example M4 and M7. The short stack of vias 901 comprises fewer metal layers than the stack of vias 301 shown in FIG. 3, although the invention is not limited to any specific number of metal layers used to form the short stack of vias.

Figure 10B:
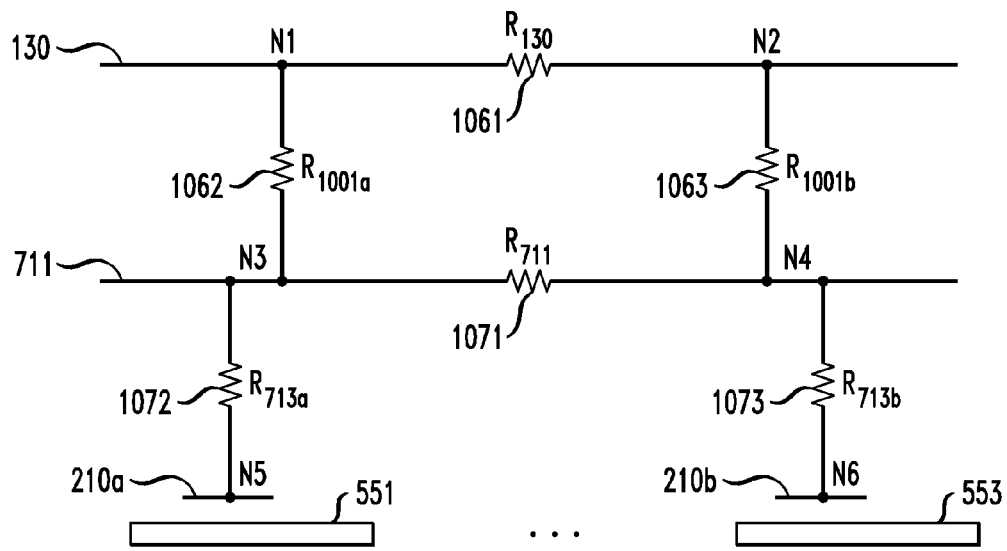

FIGS. 10A and 10B depict a cross-sectional view 1000 and corresponding schematic diagram 1050, respectively, relating to at least a portion of the exemplary extended power connecting layout 800 of FIG. 8, according to an embodiment of the present invention. With reference to FIG. 10A, a left cross section 1002a and a right cross section 1002b are shown taken through at least a portion of the extended power connecting structure 800 shown in FIG. 8. The left cross section 1002a shows a first conduction path 1001a comprising a first VDD short stack of vias 815a, a first portion of M3 VDD trace 712a, and first M3 to M2 VDD vias 714a. The first VDD short stack of vias 815a couples a left portion of VDD trace 130 to the first portion of M3 VDD trace 712a. The first portion of M3 VDD trace 712a is, in turn, coupled to a left portion of vertical M2 trace 711 through first M3 to M2 VDD vias 714a. The left portion of M2 trace 711 is coupled to a first portion of M1 VDD power rail 210a through first M2 to M1 VDD vias 713a. The first portion of M1 VDD power rail 210a is then coupled to a first row of standard cells 551.

Similarly, within the right cross section 1002b, there is a second conduction path 1001b from a right portion of VDD trace 130 to a corresponding row of standard cells. Specifically, the second conduction path 1001b comprises a second VDD short stack of vias 815b, a second portion of M3 VDD trace 712b, and second M3 to M2 VDD vias 714b. The second VDD short stack of vias 815b couples a right portion of VDD trace 130 to the second portion of M3 VDD trace 712b. The second portion of M3 VDD trace 712b is, in turn, coupled to a right portion of vertical M2 trace 711 through second M3 to M2 VDD vias 714b. The right portion of M2 trace 711 is coupled to a second portion of M1 VDD power rail 210b through second M2 to M1 VDD vias 713b. The second portion of M1 VDD power rail 210b is then coupled to a second row of standard cells 553. There may be other rows of standard cells between the first row of standard cells 551 and the second row of standard cells 553, for example, an intermediate row (or rows) of standard cells 552. The power rail and power connections associated with the intermediate row of standard cells 552 are not explicitly shown but may be formed in a manner consistent with the left and right cross sections 1002a and 1002b, respectively, described herein above.

Including the first short stack of vias 815a, first M3 to M2 VDD vias 714a, and first portion of M3 VDD trace 712a, there are five metal conductors and the vias coupling the five metal conductors in the first conduction path 1001a between the left portion of VDD trace 130 and the left portion of M2 VDD trace 711 in the illustrative extended power connecting layout shown in FIG. 10A. With reference to the resistance diagram 1050 shown in FIG. 10B, these five metal conductors and corresponding vias forming the first conduction path 1001a are represented by a first resistor 1062 having a resistance $R_{1001a}$ connected between VDD trace 130 at node N1 and M2 VDD trace 711 at node N3. Resistance $R_{1001a}$ of the first conduction path 1001a is larger than a resistance $R_{713a}$ of a second resistor 1072, representing a resistance of first M2 to M1 VDD vias 713a, connected between M2 VDD trace 711 at node N3 and the first portion of M1 VDD power rail 210a (FIG. 10A) at node N5. Resistance $R_{1001a}$ is also typically larger than a resistance (not shown) of the M2 VDD trace 711 between where the M2 VDD trace couples to first M3 to M2 VDD vias 713a and where the M2 VDD trace couples to first M3 to M2 VDD vias 714a. Likewise, second conduction path 1001b is represented by a third resistor 1063 having a resistance $R_{1001b}$ connected between VDD trace 130 at node N2 and M2 VDD trace 711 at node N4. Resistance $R_{1001b}$ of the second conduction path 1001b is larger than a resistance $R_{713b}$ of a fourth resistor 1073, representing a resistance of second M2 to M1 VDD vias 713*b*, connected between M2 VDD trace 711 at node N4 and the second portion of M1 VDD power rail 210*b* (FIG. 10A) at node N6. Resistance $R_{1001b}$ is also typically larger than a resistance (not shown) of the M2 VDD trace 711 between where the M2 VDD trace couples to second M3 to M2 VDD vias 713*b* and where the M2 VDD trace couples to second M3 to M2 VDD vias 714*b*.

A fifth resistor 1061 having a resistance $R_{130}$ is included. Resistance $R_{130}$ preferably represents a resistance of the VDD trace 130 between the connection of the VDD trace 130 with the first short stack of vias 815*a* at node N1 and the second short stack of vias 815*b* at node N2. A sixth resistor 1071 having a resistance $R_{711}$ is also included. Resistance $R_{711}$ preferably represents a resistance of the M2 VDD trace 711 between the connection of the M2 VDD trace 711 with the first short stack of vias 815*a* at node N3 and the second short stack of vias 815*b* at node N4. Because of the relatively low resistance $R_{713a}$ of the M2 to M1 vias 713*a* in comparison to the resistance $R_{1001a}$ of the first conduction path 1001*a*, the voltage drop across first M2 to M1 vias 713*a* will be relatively small, and therefore negligible, in comparison to the voltage drop across the first conduction path. Similarly, the voltage drop across second M2 to M1 vias 713*b* will be relatively small, and therefore negligible, in comparison to the voltage drop across the second conduction path 1001*b*.

Assuming that the resistance $R_{711}$ along the M2 VDD trace 711 between nodes N3 and N4 is relatively small (which is a valid assumption), the voltage difference between the first M1 VDD power rail 210*a*, supplying power to first standard cell row 551, and the second M1 VDD power rail 210*b*, supplying power to the second standard cell row 553, will be negligible. In fact, the resistance $R_{711}$ along the M2 VDD trace 711 between nodes N3 and N4 is typically small relative to the resistance $R_{1001}$ of the first conduction path 1001*a*, or could be made so by widening the M2 VDD trace 711. Therefore, even if there is a significant difference in the resistance $R_{1001a}$ or VDD voltage drop across the first conduction path 1001*a* in comparison to the resistance $R_{1001b}$ or VDD voltage drop across the second conduction path 1001*b*, the VDD voltage difference between nodes N5 and N6 will be negligible. As a result, the VDD power supply voltage differential between drivers 630 and latches 231 shown in FIG. 6, which are most distant from drivers 630, is advantageously reduced.

Because of the similarity between the VDD power distribution and VSS (or an alternative voltage supply) power distribution, the same analysis can be made for voltage drops associated with the VSS power distribution. More particularly, with respect to VSS power distribution, the voltage difference between a first node at which VSS is coupled to first standard cell row 551 and a second node at which VSS is coupled to second standard cell row 552 will be negligible. As a result, the VSS power supply voltage differential between drivers 630 and latches 231 shown in FIG. 6, which are most distant from drivers 630, is advantageously reduced.

With reference again to FIG. 7, vertical M2 VDD traces 711 and vertical M2 VSS traces 721 may be arranged, for example, as numerous as one trace per column of the latch array in a LBRAM. Likewise, horizontal M3 VDD traces 712 and horizontal M3 VSS traces 722 may be arranged, for example, as numerous as one trace per row of the latch array in the memory. However, vertical M2 VDD traces 711, vertical M2 VSS traces 721, horizontal M3 VDD traces 712, and horizontal M3 VDD traces 722 need not be arranged in such a manner. Rather, the invention contemplates various alternative arrangements of the VDD and VSS traces in the IC. For example, an advantageous power distribution arrangement comprises one horizontal M3 VDD trace 712 and one horizontal M3 VSS trace 722 coupled to two rows of standard cells or latch standard cells, according to an illustrative embodiment of the invention.

Figure 11:
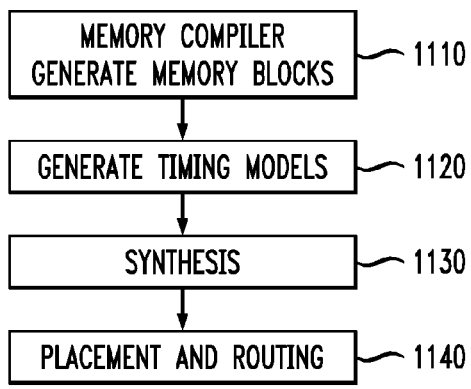
FIG. 11 illustrates an exemplary method for incorporating embodiments of the invention into an IC design flow, according to an aspect of the invention.

FIG. 11 illustrates an exemplary method 1100 for incorporating embodiments of the invention into an IC (e.g., ASIC) design flow, according to an aspect of the invention. As is known by those skilled in the art, an IC design flow is typically used to design and produce a physical representation of the various layers used to fabricate the IC. Specifically, method 1100 may apply to incorporating one or more LBRAMs, formed in accordance with embodiments of the invention, into an IC design flow.

In a first step 1110, a memory compiler preferably generates one or more LBRAM memory blocks. Memory compilers and LBRAM generation using memory compilers are known in the art. The memory compiler used in step 1110 is preferably adapted to generating one or more LBRAMs comprising features of the invention, such as, for example, the power connecting structure according to the teachings herein. The generation of one or more LBRAMs comprises generation of the circuit and, optionally, a physical layout of the LBRAM.

Method 1100 further includes a step 1120 of generating timing models for the one or more LBRAMs using, for example, electronic design automation (EDA) tools available from Synopsys, Inc., or alternative very high-speed integrated circuit (VHSIC) hardware description language (VHDL) timing models. The timing models may represent timing associated with connections to the LBRAMs. The timing models can differ between LBRAMs having different configurations, or differing in other ways.

A third step 1130 in method 1100 involves circuit synthesis. Circuit synthesis forms the electrical circuit of the IC chip from circuit building blocks, such as, for example, from various standard cells, including logic gates, registers, LBRAMs, and other functional circuit blocks. During the synthesis step 1130, timing models for the circuit building blocks, including the timing models for the LBRAMs, are preferably used to ensure that the communications among each of the circuit building blocks adheres to prescribed timing requirements of the circuit building blocks.

In step 1140, placement and routing of the circuit building blocks, including the LBRAMs, of the integrated circuit is performed. Placement may comprise determining a physical location of the circuit building blocks within the IC. Routing may comprise determining a path of electrical interconnection among the circuit building blocks.

Figure 12:
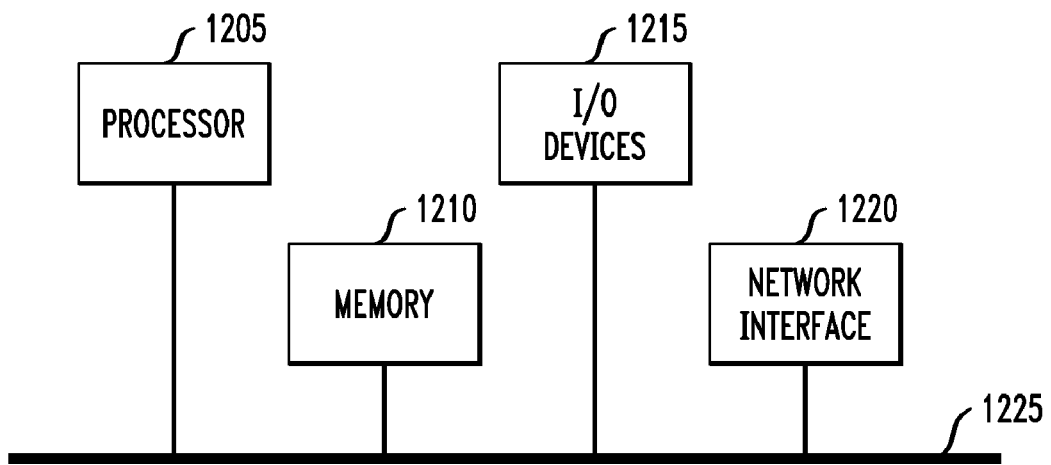
FIG. 12 is a block diagram illustrating an exemplary computing system in which techniques of the invention may be implemented, according to an embodiment of the present invention.

FIG. 12 is a block diagram illustrating an exemplary computing system 1200 in which techniques of the invention may be implemented, according to an embodiment of the present invention. System 1200 includes a processor 1205, memory 1210, input/output (I/O) devices 1215, and optionally a network interface 1220, coupled together via a computer bus 1225 or an alternative connection arrangement. In system 1200, memory 1210 preferably comprises at least one LBRAM including features of the invention described herein, such as, for example, the power connecting structure, as described in FIGS. 6-9, 10A and 10B. It is to be further understood that the individual components and/or method steps of the invention may be implemented in one or more of such computer systems. In the case of an implementation in a distributed computing system, the distributed computer system may comprise one or more computer systems implementing aspects of the invention. The individual computer systems and/or devices may be connected via a suitable network, e.g., the Internet or World Wide Web. However, the system may be realized via private or local networks. In any case, the invention is not limited to any particular network. Thus, the computer system shown in FIG. 12 may represent one or more servers.

It is to be appreciated that the term "processor" as used herein is intended to include any processing device, such as, for example, one that includes a central processing unit (CPU) and/or other processing circuitry. It is also to be understood that the term "processor" may refer to more than one processing device, and that various elements associated with a processing device may be shared by other processing devices.

The term "memory" as used herein is intended to include memory associated with a processor or CPU, such as, for example, LBRAM, random access memory (RAM), read only memory (ROM), a fixed memory device (e.g., hard disk drive), a removable memory device (e.g., diskette, compact disk, digital video disk or flash memory module), flash memory, nonvolatile memory, etc. The memory may be considered a computer readable storage medium.

In addition, the phrase "input/output devices" or "I/O devices" as used herein is intended to include, for example, one or more input devices (e.g., keyboard, mouse, camera, etc.) for entering data to the processor 1205, and/or one or more output devices (e.g., display, etc.) for presenting results associated with the processor.

Still further, the phrase "network interface" as used herein is intended to include, for example, one or more transceivers to permit the computer system 1200 to communicate with another computer system via an appropriate communications protocol.

Accordingly, software components including instructions or code for performing methodologies of invention described herein may be stored in one or more of the associated memory devices (e.g., ROM, fixed or removable memory) and, when ready to be utilized, loaded in part or in whole (e.g., into RAM) and executed by a CPU or alternative processor.

In any case, it is to be appreciated that the teachings of the invention described herein and shown in the appended figures, may be implemented in various forms of hardware, software, or combinations thereof, e.g., one or more operatively programmed general purpose digital computers with associated memory, one or more implementation-specific ICs, functional circuitry, etc. Given the techniques of the invention provided herein, one of ordinary skill in the art will be able to contemplate other implementations of the techniques of the invention.

At least a portion of the techniques of the present invention may be implemented in one or more ICs. In forming ICs, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Figure 13:
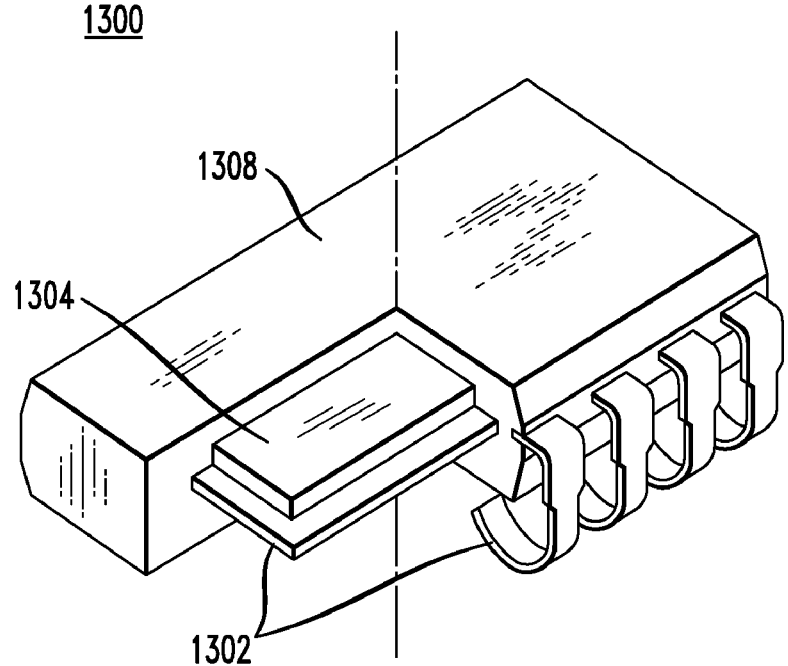
FIG. 13 is a partial cut-away view depicting an exemplary packaged IC device comprising a power connecting structure formed in accordance with an embodiment of the present invention.

FIG. 13 is a partial cut-away view depicting an exemplary packaged IC device 1300 comprising a power connecting structure formed in accordance with an embodiment of the present invention. The packaged IC device 1300 comprises a leadframe 1302, a die 1304 attached to the leadframe, the die including a power connection arrangement according to an embodiment of the invention, and a plastic encapsulation mold 1308 surrounding the die and leadframe. Although the figure depicts only one type of IC package, the invention is not so limited; rather, the invention may comprise an IC die enclosed in any package type.

An IC in accordance with the present invention can be employed in essentially any application and/or electronic system. Suitable systems for implementing the invention may include, but are not limited to, personal computers, communication networks, electronic commerce systems, portable communications devices (e.g., cell phones), solid-state media storage devices, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An integrated circuit structure for distributing power to one or more standard cells in an integrated circuit, the integrated circuit structure comprising:
    a first plurality of standard cells arranged in a first standard cell row, each of the first plurality of standard cells including first and second power rails adapted for connection to a voltage supply and a voltage return, respectively, of the standard cells, each standard cell in a subset of the first plurality of standard cells being arranged in direct abutment with at least two other standard cells of the first plurality of standard cells, the first plurality of standard cells including at least first and second end cells arranged in direct abutment with at least one other standard cell of the first plurality of standard cells; and
    a power mesh power connection structure including a plurality of conductive elements formed in a plurality of different conductive layers in the integrated circuit, the power mesh power connection structure being operative to connect the first and second power rails of the first plurality of standard cells to the voltage supply and voltage return, respectively, and being configured so as to reduce a first voltage differential between respective first power rails of the first plurality of standard cells and to reduce a second voltage differential between respective second power rails of the first plurality of standard cells.

2. The integrated circuit structure of claim 1, wherein the power mesh power connection structure comprises:
    a first conductive layer including at least first and second conductors coupled to the first and second power rails, respectively, of the first plurality of standard cells;
    a second conductive layer formed above the first conductive layer and including at least third and fourth conductors, the third and fourth conductors being arranged substantially perpendicular to the first and second conductors, the first and third conductors being electrically coupled together, and the second and fourth conductors being electrically coupled together;
    a third conductive layer formed above the second conductive layer and including at least fifth and sixth conductors, the fifth and sixth conductors being arranged substantially perpendicular to the third and fourth conductors, the fifth and third conductors being electrically coupled together, and the sixth and fourth conductors being electrically coupled together; and
    at least a fourth conductive layer formed above the third conductive layer and including at least seventh and eighth conductors, the seventh and eighth conductors being arranged substantially perpendicular to the fifth and sixth conductors, the seventh and fifth conductors being coupled together and the eighth and sixth conductors being coupled together, wherein the seventh and eighth conductors are adapted for connection to the voltage supply and voltage return, respectively.

3. The integrated circuit structure of claim 2, wherein a resistance of the first and second conductors is substantially less than a first resistance of at least a first electrical path between at least one conductor in the second conductive layer and the voltage supply and a second resistance of at least a second electrical path between at least one conductor in the second conductive layer and the voltage return.

4. The integrated circuit structure of claim 2, wherein at least one conductor in a given one of the conductive layers is coupled to at least one corresponding conductor in an adjacent one of the conductive layers by at least a first stack of vias.

5. The integrated circuit structure of claim 4, wherein the at least first stack of vias comprises a plurality of conductive segments, each of the conductive segments being formed in a different conductive layer, adjacent conductive segments being coupled together by at least one corresponding via.

6. The integrated circuit structure of claim 4, wherein at least one of the first and second power rails of the respective first plurality of standard cells is coupled to the at least first and second conductors, respectively, by at least a second stack of vias, a resistance of the second stack of vias being less than a resistance of the first stack of vias.

7. The integrated circuit structure of claim 1, wherein the power mesh power connection structure is formed at least partially over the first plurality of standard cells.

8. The integrated circuit structure of claim 1, wherein at least one of the first plurality of standard cells comprises a latch-based random access memory standard cell.

9. The integrated circuit structure of claim 2, wherein a given one of the conductors in a corresponding one of the conductive layers is defined by length along a first direction, the given one of the conductors being coupled to another conductor in an adjacent one of the conductive layers through a first coupling comprising one or more vias, and wherein at most one of the one or more vias is placed along the first direction.

10. The integrated circuit structure of claim 1, further comprising at least a second plurality of standard cells arranged in a second standard cell row, each of the second plurality of standard cells including first and second power rails adapted for connection to the voltage supply and the voltage return, respectively, of the second plurality of standard cells, each standard cell in a subset of the second plurality of standard cells being arranged in direct abutment with at least two other standard cells of the second plurality of standard cells, the second plurality of standard cells including at least first and second end cells arranged in direct abutment with at least one other standard cell of the second plurality of standard cells.

11. The integrated circuit structure of claim 10, wherein the at least first and second conductors in the first conductive layer are coupled to the first and second power rails, respectively, of the second plurality of standard cells.

12. The integrated circuit structure of claim 10, wherein the power mesh power connection structure is formed at least partially over the first and second plurality of standard cells.

13. The integrated circuit structure of claim 10, wherein the second plurality of standard cells is arranged in direct abutment with the first plurality of standard cells.

14. The integrated circuit structure of claim 10, wherein the second plurality of standard cells comprises at least one of latch standard cells, logic standard cells, amplifier standard cells, analog standard cells, timing standard cells, flip-flop standard cells, and memory standard cells.

15. The integrated circuit structure of claim 1, wherein the first plurality of standard cells comprises at least one of latch standard cells, logic standard cells, amplifier standard cells, analog standard cells, timing standard cells, flip-flop standard cells, and memory standard cells.

16. An integrated circuit, comprising at least one integrated circuit structure according to claim 1.

17. A method of forming an integrated circuit structure for distributing power to one or more standard cells in an integrated circuit, the method comprising the steps of:
    forming a first plurality of standard cells on a substrate, each of the first plurality of standard cells including first and second power rails adapted for connection to a voltage supply and a voltage return, respectively, of the standard cells, each standard cell in a subset of the first plurality of standard cells being arranged in direct abutment with at least two other standard cells of the first plurality of standard cells, the first plurality of standard cells including at least first and second end cells arranged in direct abutment with at least one other standard cell of the first plurality of standard cells; and
    forming a power mesh power connection structure, the power mesh connection structure including a plurality of conductive elements formed in a plurality of different conductive layers in the integrated circuit and being configured to connect the first and second power rails of the first plurality of standard cells to the voltage supply and voltage return, respectively, the power mesh connection structure being configured so as to reduce a first voltage differential between respective first power rails of the first plurality of standard cells and to reduce a second voltage differential between respective second power rails of the first plurality of standard cells.

18. The method of claim 17, wherein the step of forming the power mesh power connection structure comprises:
    forming a first conductive layer including at least first and second conductors coupled to the first and second power rails, respectively, of the first plurality of standard cells;
    forming a second conductive layer above the first conductive layer and including at least third and fourth conductors, the third and fourth conductors being arranged substantially perpendicular to the first and second conductors, the first and third conductors being electrically coupled together, and the second and fourth conductors being electrically coupled together;
    forming a third conductive layer above the second conductive layer and including at least fifth and sixth conductors, the fifth and sixth conductors being arranged substantially perpendicular to the third and fourth conductors, the fifth and third conductors being electrically coupled together, and the sixth and fourth conductors being electrically coupled together; and
    forming at least a fourth conductive layer above the third conductive layer and including at least seventh and eighth conductors, the seventh and eighth conductors being arranged substantially perpendicular to the fifth and sixth conductors, the seventh and fifth conductors being coupled together and the eighth and sixth conductors being coupled together, wherein the seventh and eighth conductors are adapted for connection to the voltage supply and voltage return, respectively.

19. The method of claim 18, further comprising the step of coupling at least one conductor in a given one of the conductive layers to at least one corresponding conductor in an adjacent one of the conductive layers using at least a first stack of vias, wherein a step of forming the at least first stack of vias comprises forming a plurality of conductive segments, each of the conductive segments being formed in a different conductive layer, and coupling adjacent conductive segments together using at least one corresponding via.

20. An article of manufacture for designing an integrated circuit, the article comprising a computer readable storage medium having one or more programs embodied therewith, wherein the one or more programs, when executed by a computer, perform steps of:

forming a first plurality of standard cells on a substrate, each of the first plurality of standard cells including first and second power rails adapted for connection to a voltage supply and a voltage return, respectively, of the standard cells, each standard cell in a subset of the first plurality of standard cells being arranged in direct abutment with at least two other standard cells of the first plurality of standard cells, the first plurality of standard cells including at least first and second end cells arranged in direct abutment with at least one other standard cell of the first plurality of standard cells; and forming a power mesh power connection structure, the power mesh connection structure including a plurality of conductive elements formed in a plurality of different conductive layers in the integrated circuit and being configured to connect the first and second power rails of the first plurality of standard cells to the voltage supply and voltage return, respectively, the power mesh connection structure being configured so as to reduce a first voltage differential between respective first power rails of the first plurality of standard cells and to reduce a second voltage differential between respective second power rails of the first plurality of standard cells.

* * * * *